United States Patent [19]

Young

[11] Patent Number: 5,481,475

[45] Date of Patent: Jan. 2, 1996

[54] METHOD OF SEMICONDUCTOR DEVICE REPRESENTATION FOR FAST AND INEXPENSIVE SIMULATIONS OF SEMICONDUCTOR DEVICE MANUFACTURING PROCESSES

[75] Inventor: Ralph W. Young, Poughkeepsie, N.Y.

[73] Assignee: International Business Machines Corporation, Armonk, N.Y.

[21] Appl. No.: 166,181

[22] Filed: Dec. 10, 1993

[51] Int. Cl.⁶ .................................................... H01F 41/14
[52] U.S. Cl. .......................... 364/491; 364/488; 364/578
[58] Field of Search ..................................... 364/488, 489, 364/490, 491, 578; 437/54, 61–64

[56] References Cited

U.S. PATENT DOCUMENTS

| | | | |
|---|---|---|---|
| 4,922,432 | 5/1990 | Kobayashi et al. | 364/490 |
| 5,008,723 | 4/1991 | van der Have | 357/23.7 |
| 5,097,422 | 3/1992 | Corbin, II et al. | 364/491 |
| 5,213,993 | 5/1993 | Ogino et al. | 437/62 |
| 5,252,505 | 10/1993 | Yatsuda et al. | 437/40 |
| 5,351,197 | 9/1994 | Upton et al. | 364/491 |

*Primary Examiner*—Kevin J. Teska
*Assistant Examiner*—Stephen J. Walder, Jr.
*Attorney, Agent, or Firm*—Whitham, Curtis, Whitham & McGinn; Eric Petraske

[57] ABSTRACT

A data structure is used in semiconductor process integration studies for manufacture of device structures, where one dimension of the data structure is used to represent each film layer in the device and one or two additional dimensions represent vertical regions within the device. Primary data values within this data structure are the thickness of film layers at the corresponding vertical region. Using this data structure, process integration studies can be performed rapidly and efficiently on a microcomputer. The data structure simplifies the identification of overetching and overfilling, facilitating the use of thinner film layers and shorter process steps. Statistical simulations, to account for process control limitations on the uniformity of deposition and etching rates, are easily accommodated by a natural extension of the data structure to an additional dimension.

12 Claims, 8 Drawing Sheets

STATISTICAL CASES

METHOD OF SEMICONDUCTOR DEVICE REPRESENTATION FOR FAST AND INEXPENSIVE SIMULATIONS OF SEMICONDUCTOR DEVICE MANUFACTURING PROCESSES

BACKGROUND OF THE INVENTION

1. Field of the Invention

The present invention generally relates to the field of semiconductor process controls and, more particularly, to methods for simulating device structures in integrated process studies.

2. Description of the Prior Art

Integrated process studies which simulate the steps used in manufacturing semiconductor devices use data structures to represent physical device structures. These studies typically consist of one to fifteen device layouts used to pattern films which are formed by one hundred to several hundred process steps. The process steps include depositions, wet etching, reactive ion etching (RIE), oxidations, chemical-mechanical polishing, implantations, and masking. It is desirable to obtain the simulation results in less than a few minutes so that many variations of layouts, film thickness, and overetches can be included as the semiconductor process is initially studied.

In the prior art, rectangular grids and triangular grids have been used in structure simulations. State of the art tools use a string algorithm for two dimensional simulations. Solids bounded by polygons have been used in three dimensional simulations. In the string algorithm, the boundaries between materials are represented by a sequence of vertices connected by straight lines at arbitrary slopes. These data structures have no natural extension for statistical simulations. Consequently, it is an exceedingly complex matter in the prior art to take into account variation in film thickness and etching and deposition rates within process control limitations.

There are two complications which arise during the simulations which are related to the data structure. The first is overetching, and the second is overfilling.

Overetching may occur during any film-removal process step, such as wet etching, reactive ion etching, oxidation, and chemical-mechanical polishing. When an initial film is completely removed in any region, underlying films are then exposed for the remainder of that process step. These underlying films usually would have a different removal rate from the initial film. The complication is in discovering which underlying films have been exposed and how much time is left in the removal step for each region where an overetch occurred.

Over filling may occur during any film-growth process step. These steps include oxidation and deposition, where growth in film thickness is in a direction normal to exposed surfaces. Thus a vertical surface will grow horizontally, forming a "sidewall". When two facing vertical surfaces grow in this fashion they may meet, thereby eliminating the vertical surfaces or "overfilling" the region between the two facing surfaces, that is, the simulation will generate and unphysical overlapping that does not occur in the real process. The occurrence of overfilling must be detected and the device structure representation modified appropriately in these regions.

The device structures which evolve during the simulations need to be represented compactly by the data structure for two reasons. First, it is desirable to be able to do these simulations on a personal computer (PC) to reduce their cost. This is important for memory limitations on a personal computer. However, the more important consideration is for speed of simulations, especially for statistical simulations.

SUMMARY OF THE INVENTION

It is therefore an object of the present invention to provide a method which can be used to quickly and efficiently simulate device structures in integrated process studies.

It is another object of the invention to provide a method which can support statistical simulations for designing yield and reliability into semiconductor device processes.

It is a further object of the invention to represent device structures in such a manner that the representations are compact and remain compact during device evolution, in order to provide for rapid simulations, especially for statistical simulations.

It is yet another object of the invention to represent device structures in a compact manner to accommodate memory limitations on a personal computer, thereby enabling simulations on a personal computer to reduce their cost.

It is another object of the invention to provide a simulation model which is able to treat overetching and overfilling in a single time step per layer.

Another object of the invention is to enable use of film layers which are as thin as possible, particularly in the early steps of an integrated process, thereby simplifying later steps by reducing topography.

According to the present invention a data structure is used in semiconductor process integration studies for manufacture of device structures, where one dimension of the data structure is used to represent each film layer in the device and one or two additional dimensions represent vertical regions within the device. Primary data values within this data structure are the thickness of film layers at the corresponding vertical region. Using this data structure, process integration studies can be performed rapidly and efficiently on a microcomputer. The data structure simplifies the identification of overetching and overfilling, facilitating the use of thinner film layers for reduced topography. Statistical simulations, to account for process control limitations on the uniformity of deposition and etching rates, are easily accommodated by a natural extension of the data structure to an additional dimension.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

In the practice of the invention, data is stored in a two-dimensional matrix for a two-dimensional simulation. Each column of the matrix represents a vertical region of the device structure. The regions are variable in width, which permits large uniform areas to be represented by a single region, thus minimizing the memory requirements of the data structure and reducing processing requirements for the study. The matrix is regenerated during the simulation to reflect evolution of the region structure with each step in the process.

Each row of the matrix represents a specific film in the process sequence. Each entry in the matrix is the thickness of a film for the corresponding row and column. Entries are zero in regions where the corresponding film does not exist. Information is kept for each row giving the film material and the process step in which the film was created. Additional information giving the physical width of the represented region is maintained for each column.

This is different from a rectangular grid representation in which all the elements in a row correspond to regions which are at the same vertical position in the device structure. According to the invention, the vertical position of a specific element in the matrix is simply obtained by summing the thickness of the elements below in the same column. Because underlying film layers may have different thicknesses in different regions, the vertical position of a film layer may vary from region to region, and therefore from column to column. Vertical surfaces are implicitly represented by adjacent columns having different vertical positions for the same film layer. All material boundaries are vertical or horizontal in order to maintain a simple data structure. Slopes and rounded corners are approximated by a series of adjacent columns resulting in staircase shapes.

The method of the present invention results in a device representation which is more compact than previous solutions and enables the simulations to be completed in a fraction of the time required for prior art data structures. This makes it possible to perform integrated process studies efficiently and rapidly. Also, the present invention has a natural extension for statistical simulations. The present invention is amenable to one time step per film rather than many small time steps. The overetching and overfilling problems are inherently simpler, greatly reducing simulation time. The method's application to a three-dimensional simulation is an extension of the above to a three-dimensional matrix.

Figure 1A:
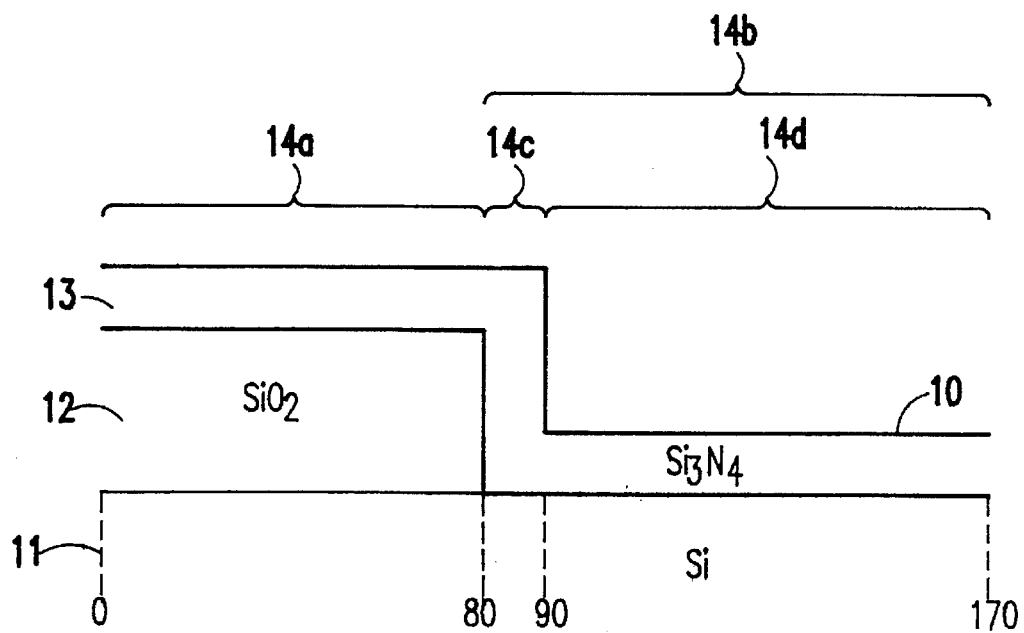
FIG. 1A is a representative cross-sectional view of a portion of a simplified semiconductor device and FIG. 1B shows a matrix representation of the device information shown in FIG. 1A.
Figure 1B:
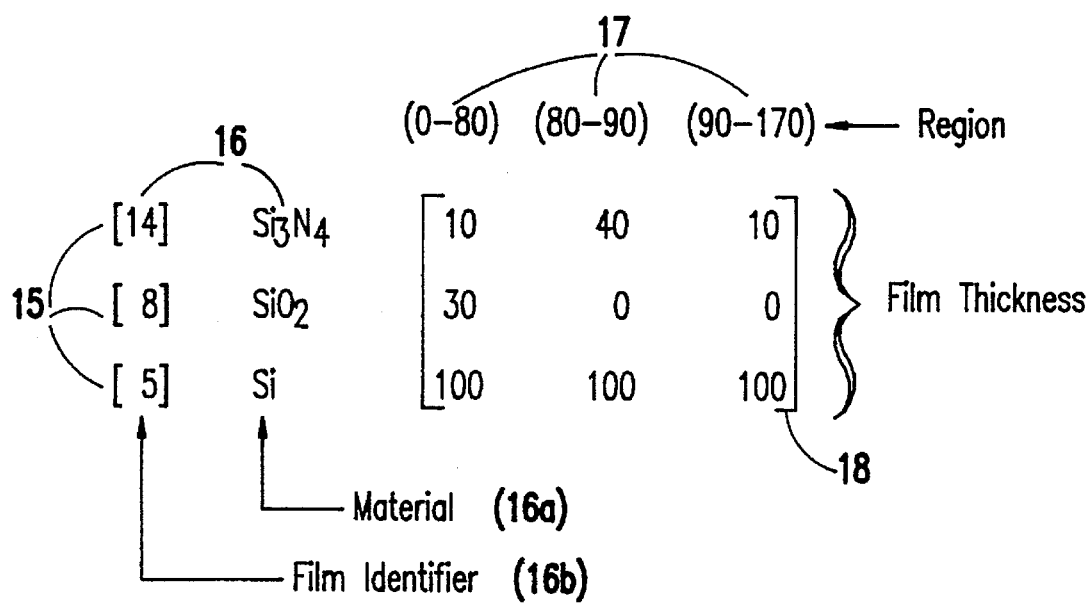

Referring now to the drawings, and more particularly to FIG. 1A, there is shown a simplified diagram of a device 10 after several steps in an integrated process study. The initial layer of silicon 11 is represented as having a thickness of 100 in the film thickness matrix 18 (FIG. 1B) comprised of values in rows 15 and columns 17. At the beginning of the study, the matrix 18 would have had a single cell of value 100 reflecting the initial silicon layer 11. The next step in the example adds a silicon dioxide layer 12. This may have been accomplished by masking the 80–170 region 14b and reacting silicon dioxide ($SiO_2$) 12 to a thickness of 30, or by depositing silicon dioxide over the entire 0–170 region 14 and then masking the 0–80 region 14a and etching until silicon dioxide deposits in the 80–170 region 14b have been removed. There would result a two-by-two matrix with rows 15 for silicon dioxide 12 and silicon 11 and columns 17 for region 0–80 14a and region 80–170 14b.

An important feature of the invention is the dynamic nature of the matrix 18. The number of rows 15 and columns 17 in each step are never more than necessary to describe the physical device at each step. This simplifies calculations and minimizes the size of matrix 18 during the study, thereby enabling implementation of the study on a personal computer.

In the final step of the example shown in FIG. 1A, silicon nitride ($Si_3 N_4$) 13 is deposited across the entire device 10 to a thickness of 10 in regions 0–80 14a and 90–170 14d and to a thickness of 40 in region 80–90 14c. This is accomplished by a single conformal deposition, with the added thickness in the 80–90 region being accounted for by deposition along the vertical drop at the boundary between the 0–80 region 14a and 80–170 region 14b. The result is the three-by-three matrix 18 shown in FIG. 1B.

Figure 2A:
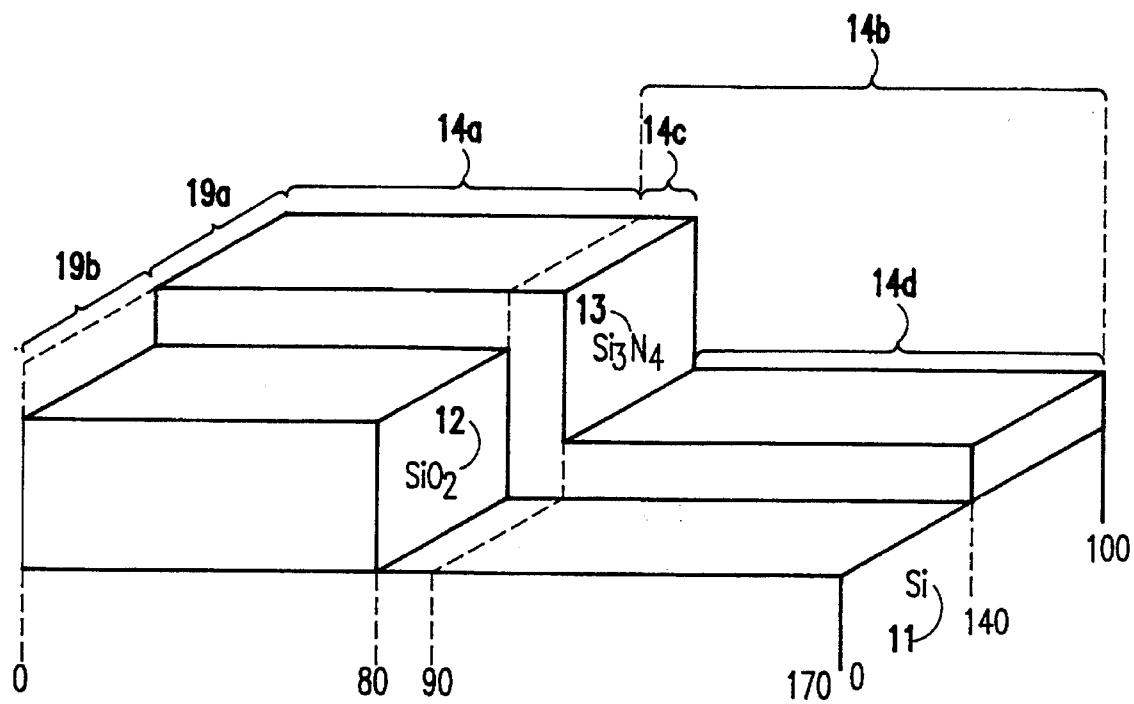
FIG. 2A is a cross-sectional and isometric view of a portion of a simplified semiconductor device and FIG. 2B shows a matrix representation of the three dimensional device information shown in FIG. 2A.

FIG. 2A shows an extension of the diagram and matrix to three dimensions. The full depth 0–100 is divided into two regions 0–40 19b and 40–100 19a, where it is evident that the 40–100 region corresponds to the results described above for FIG. 1A, and the 0–40 region 19b reflects masking during the final step described above for FIG. 1A.

Figure 2B:
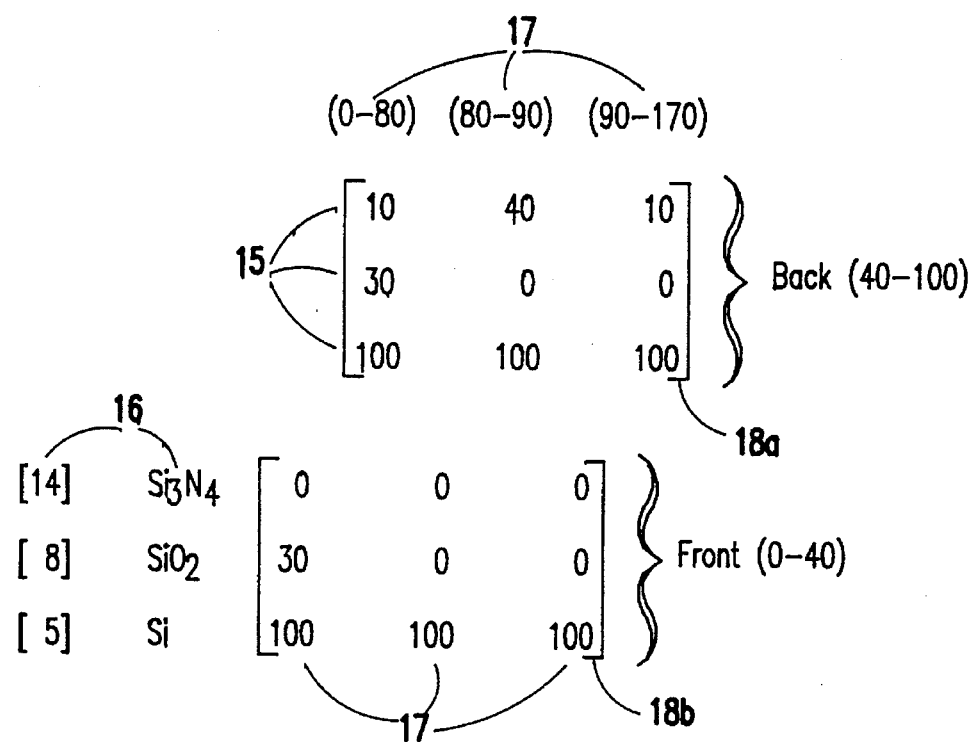

With the addition of a third dimension, in the simplified example described, there are now shown two three-by-three tables in FIG. 2B. One table 18a corresponds to the 40–100 region 19a and is the same as the three-by-three matrix 18 shown in FIG. 1B. A second table 18b corresponds to the 0–40 region 19b. Note that this second table 18b reflects the results of the study described for FIG. 1A prior to the final step of the study. Second table 18b is a mapping of the two-by-two results prior to the final step onto the three-by-three space corresponding to division of the 80–170 region 14b into the 80–90 region 14c and the 90–170 region 14d, with a row of zeros reflecting absence of silicon nitride in the final step.

Overetching is readily handled by etching each film in a given row of the data matrix sequentially from top to bottom. The remaining overetch time for each column is maintained at each step. This is possible because of the assumption that the bottom of the film in each region is horizontal. Only one time step per film is needed with this approach.

Figure 3A:
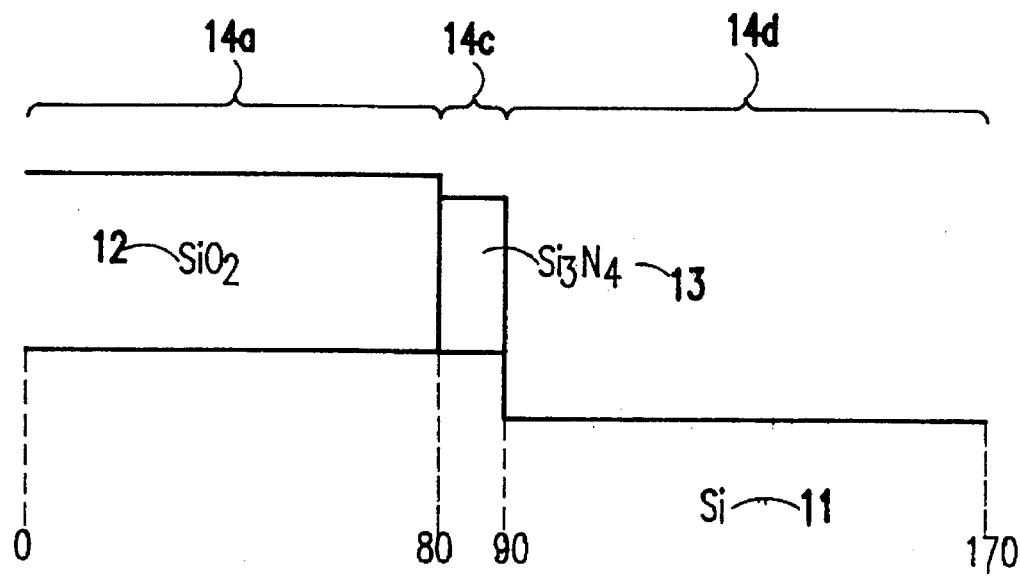
FIG. 3A is a cross-sectional view of the example shown in FIG. 1A showing the effect of overetching and FIG. 3B is the corresponding matrix representation of the results shown in FIG. 3A.
Figure 3B:
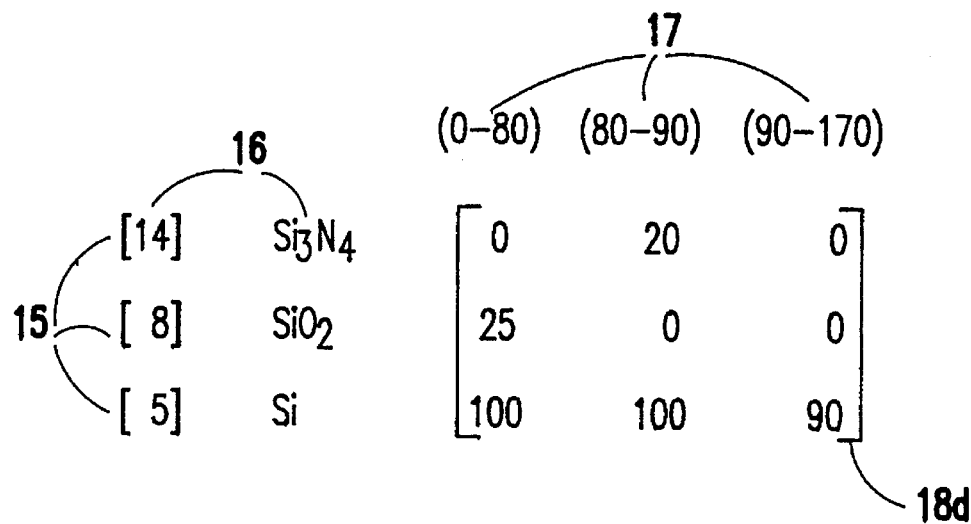

FIG. 3A shows the results of overetching after deposition of silicon nitride 13 in FIG. 1A. Comparing three-by-three matrix 18 in FIG. 1B to three-by-three matrix 18d in FIG. 3B, it will be seen that etching has continued in FIG. 3A to change the thickness of the uppermost layers. In the 0–80 region 14a etching has removed silicon nitride 13 entirely and has eaten into the silicon dioxide layer 12, reducing it to a thickness of 25. In the 80–90 region 14c a thickness of 20 remains in the silicon nitride layer. The silicon layer 11 in the 90–170 region 14d has been reduced to a thickness of 90. Note that the etching rates are different in the different layers.

Figure 4A:
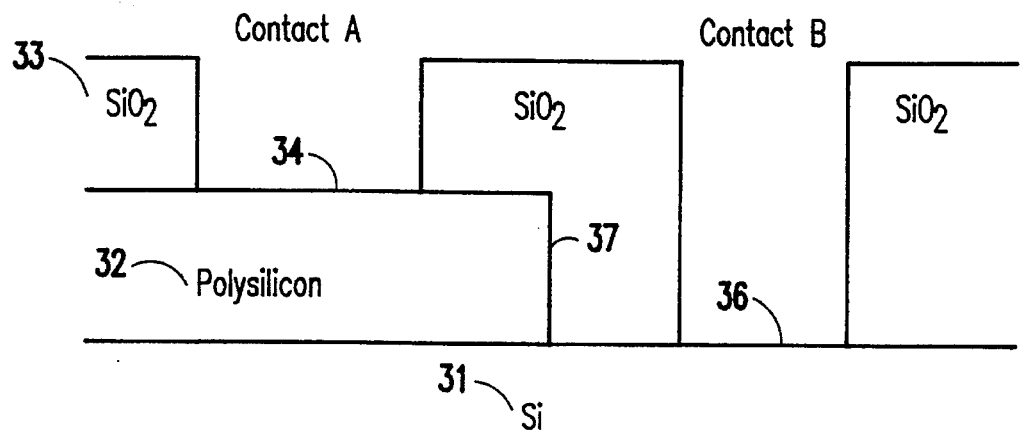
FIG. 4A is a cross-sectional view of a portion of an idealized semiconductor device structure having openings for contacts.
Figure 4B:
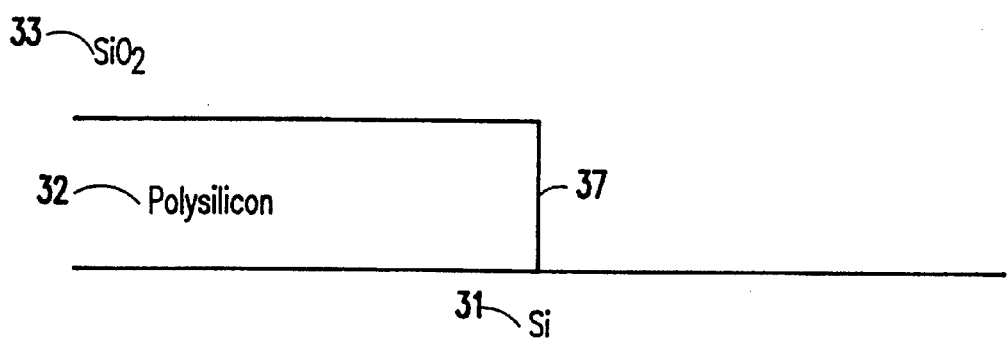
FIGS. 4B and 4C are views of the same cross-section before and after a process step to etch the contact openings in a real semiconductor device structure, showing overetching.
Figure 4C:
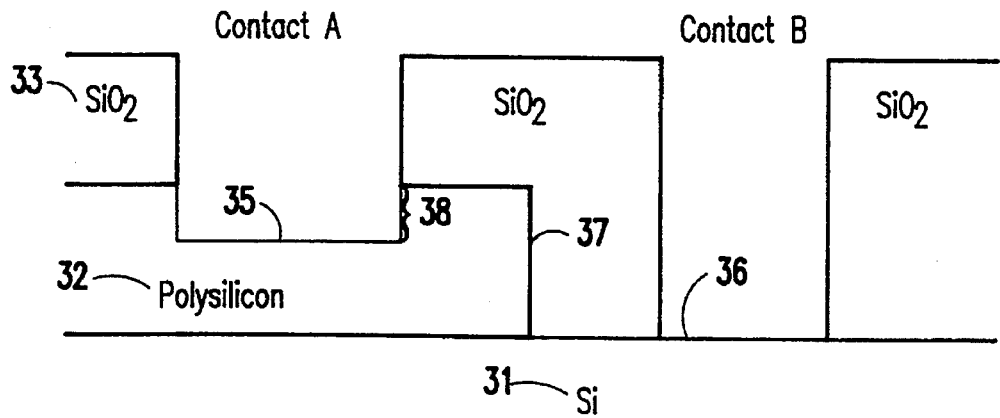

FIGS. 4A to 4C are used to illustrate application of the invention to overetching. FIG. 4A shows a desired device result; specifically, creation of contact surfaces 34 and 36 following deposition of polysilicon 32 and silicon dioxide 33 upon a base 31 of silicon starting with the structure shown in FIG. 4B. The polysilicon layer 32 extends only part way over silicon base 31, stopping at edge 37. However, the topography created by the polysilicon edge 37 makes it difficult to etch contact openings A and B through the layer of silicon dioxide 33 at the same time. Since contact B requires much more etching than contact A, contact A will be substantially overetched if the etching for both contacts is done in the same process step.

The overetching is shown by contact surface 35 in FIG. 4C, where the etching for contact opening A has eaten into the polysilicon layer 32 to a certain depth 38. The invention facilitates identification of regions where etching is taking place. The invention simplifies calculation of how much time is left in the removal step for each exposed film layer in a region. Under the prior art, it is difficult to identify specific regions where overetching is taking place and to know how much time is left in the removal step. Consequently, in order to provide sufficient margin for error, prior art processes tend toward thicker film layers. Through operation of the invention, it is feasible to minimize the thickness of the polysilicon layer 32, while accounting properly for the overetch 38.

Figure 5A:
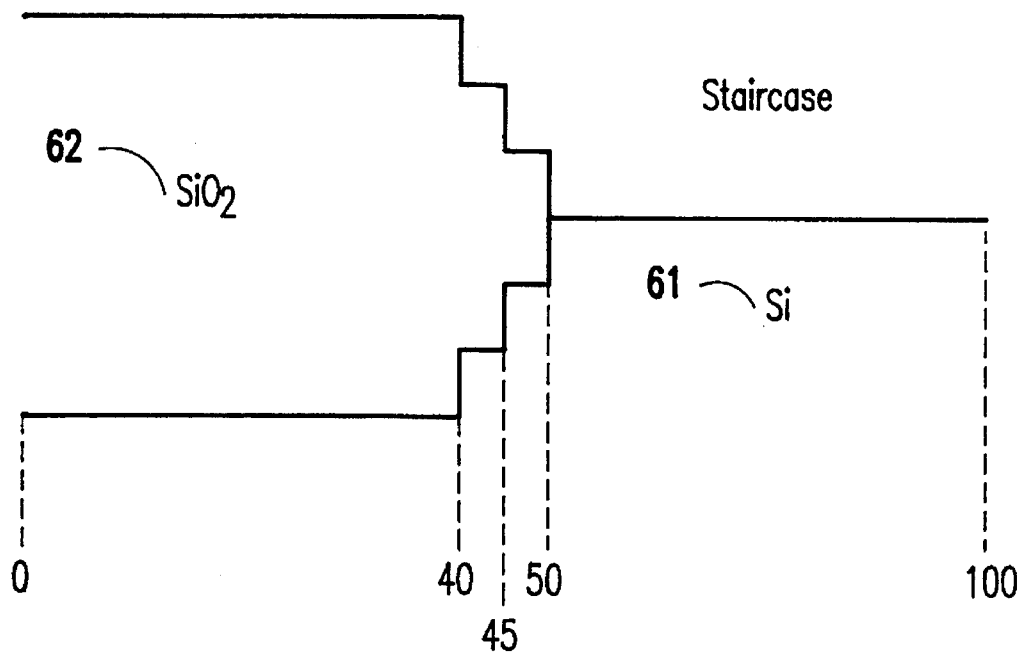
FIG. 5A is a cross-sectional view of an example of a portion of a semiconductor device showing staircase approximations.
Figure 5B:
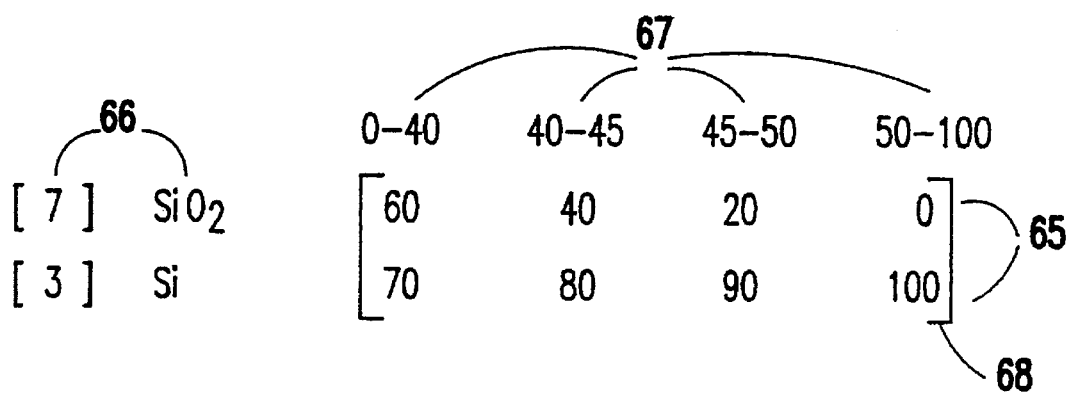
FIG. 5B is a corresponding matrix representation showing staircase approximations.

A key element in the invention is the assumption that all material surfaces are vertical or horizontal. In practice, however, some surfaces have slopes. These slopes are approximated using staircase regions, as shown in FIG. 5A. Oxidation of silicon 61 to form silicon dioxide 62 layer has resulted in walls which slope in the 40–50 region. To approximate this slope this region is divided up into multiple regions. For the purposes of illustration, two regions are shown. In practice, however, a region such as this might be broken into ten or more regions. The staircase effect is achieved by appropriate adjustments in layer thicknesses for the additional regions. In FIG. 5B, matrix 68 composed of rows 65 corresponding to film layers and columns 67 corresponding to vertical regions, the 40–45 region is shown with a thickness of 80 in the silicon layer and a thickness of 40 in the silicon dioxide layer. The 45–50 region shows a step up to a thickness of 90 in the silicon layer and a reduced thickness of 20 in the silicon dioxide layer, resulting in a net step down of 10 in the exposed silicon dioxide surface layer.

Process steps which create sidewall regions are represented by the addition of columns. A check is made to prevent facing sidewall regions from overfilling. This check is simplified because the method assumes that all sides are vertical.

Figure 6A:
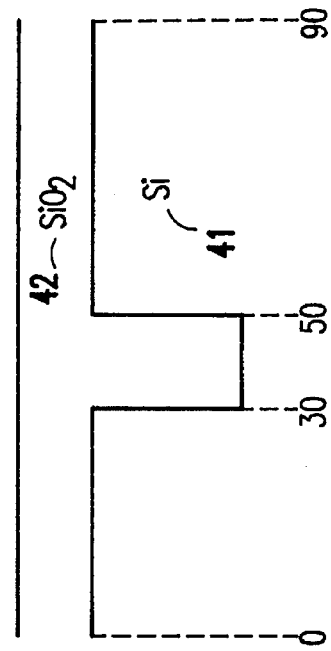
FIGS. 6A and 6C are cross-sectional views of a simplified device structure having a trench, before and after overfilling, and FIGS. 6B and 6D, respectively, show the corresponding matrix representations.
Figure 6C:
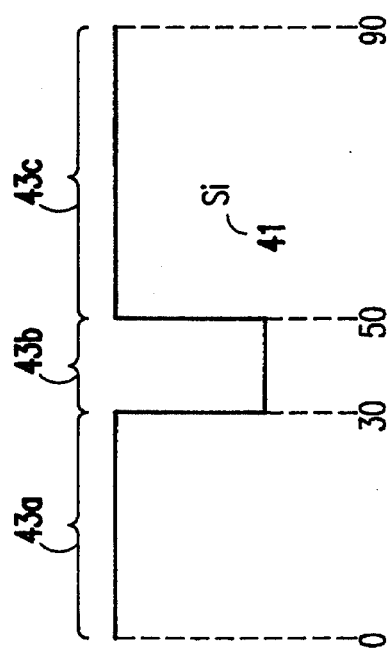
Figure 6B:
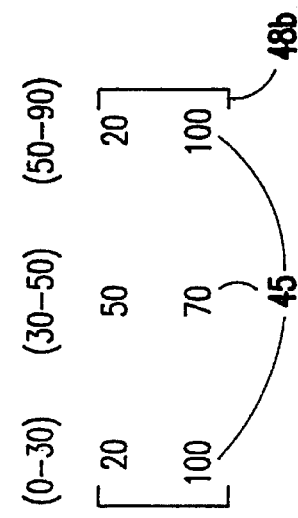
Figure 6D:
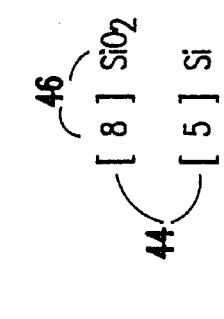

The results of overfilling a trench are shown in FIGS. 6A and 6C. FIG. 6A shows the device prior to overfilling. The matrix defined by row 44 and columns 45 in FIG. 6D shows a thickness of 100 in the 0–30 region 43a, a thickness of 70 in the 30–50 region 43b and a thickness of 100 in the 50–90 region 43c. A conformal deposition of silicon dioxide would build up along the facing vertical surfaces at the 30 and 50 unit positions as well as along all exposed horizontal surfaces. If the deposition process is long enough to allow accumulation of a depth of 20 units, the model would create two facing sidewall regions, one beginning at 30 and moving to the right for 20 units and the other beginning at 50 and moving left for 20 units. Because these sidewall regions overlap after deposition of 10 units, there will be a negative spacing between the adjoining vertical edges between these two sidewall regions.

Overfilling is prevented by not allowing any negative spacings of vertical edges along the surface, which in this example results in the combination of both sidewall regions into a single region. This can also be done in one time step per film. In practical implementations where an actual device is produced, a seam forms along a vertical in the center of the 30–50 region, with a dimple at the top of this vertical. The dimple tends to dissipate with further deposition. After the overfilling, a silicon dioxide layer has been added with a thickness of 20 in the 0–30 region 43a, a thickness of 50 in the 30–50 region 43b, and a thickness of 20 in the 50–90 region 43c.

Simulations which vary the vertical dimensions statistically are handled by giving the data structure matrix an additional integral dimension for representing the statistical cases. In order to analyze the effects of variation in film deposition and etching rates, a range of values is established for each process step. For each statistical case a random value is selected within each range. Because of the simplicity of the model, the statistical cases for any region are readily accumulated in the cells along the statistical dimension. This contrasts with prior art where fixed grid locations and conventional algorithms make it difficult to locate the boundaries of any particular region and to compile desired results from statistical case to statistical case.

Figure 7:
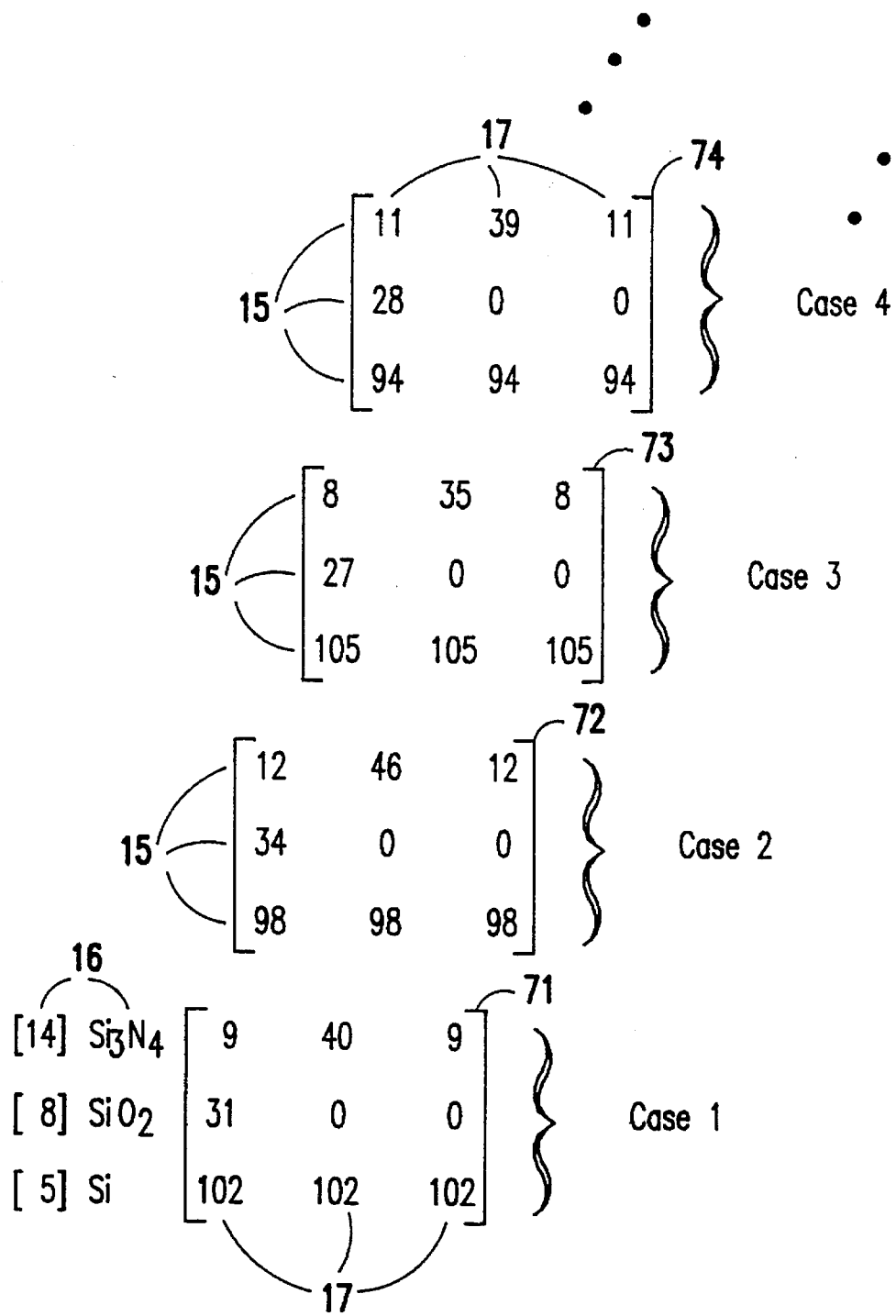
FIG. 7 is a three dimensional matrix illustrating how statistical cases are represented in accordance with the invention for the geometry of FIG. 1.
Figure 8:
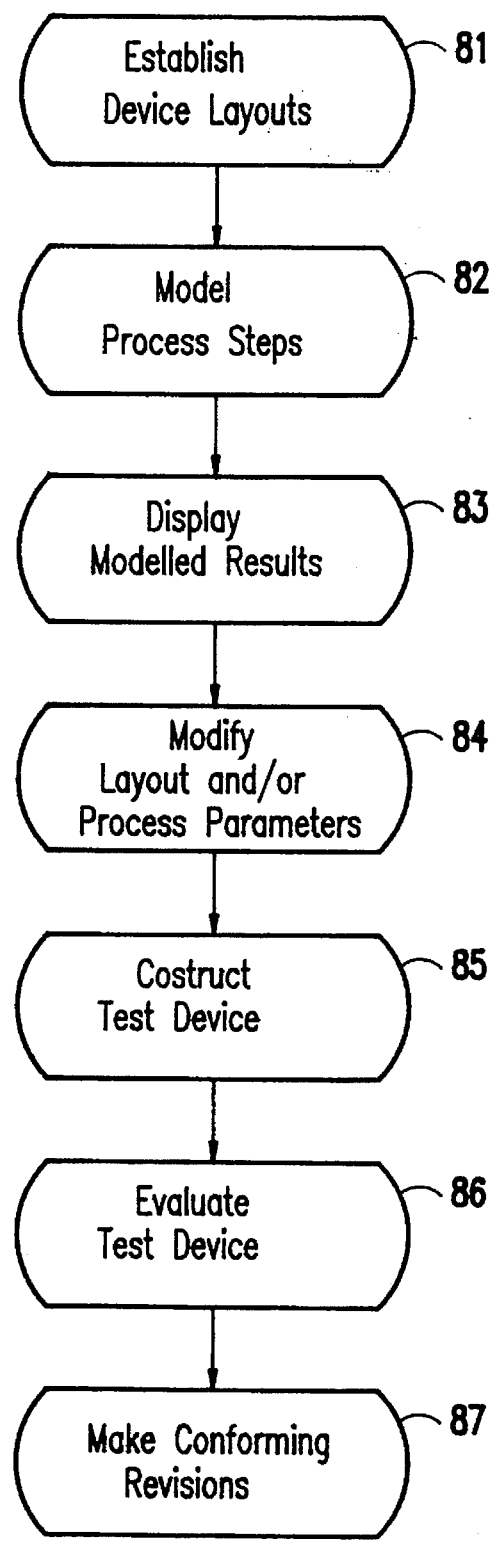
FIG. 8 is a flow chart showing the steps in the manufacture of a semiconductor device in accordance with a device structure and using semiconductor process integration studies to optimize the manufacturing process.

The representation of statistical cases is shown in FIG. 7. Statistical analysis is useful because physical and process control limitations in manufacturing result in variations in deposition and etching rates and times, with consequent variation in the thickness of film layers. A range of values is established for each of these variables. The model is then run successively, using a different set of values, selected at random within the established range for each variable. FIG. 8 shows statistical running of the model for the device represented in FIG. 1A. Matrices 71, 72, 73, and 74 are the results of multiple geometries run simultaneously.

The foregoing methodology, using statistical analysis as appropriate to account for physical limitations, facilitates fine tuning of manufacturing design and process control steps to accomplish device construction within electrical and physical design tolerances producing devices with minimum topography without sacrificing structural integrity. As implemented in its best mode, statistical cases are used to focus on particular regions which are shown by device testing to run close to tolerances. Experience has shown that while overfilling is accurately predicted by the model, etching tolerances are more difficult to deal with and it is best to use a "worst case" approach.

While each iteration of the model is completely automatic, the results are displayable on a video terminal during running of the model. This facilitates identification of problems in construction of a device in accordance with design objectives, and generation of alternative assumptions for successive iterations of the model in the course of an integrated study. An additional feedback loop is provided by testing and analysis of actual devices produced in accordance with the process control parameters established after multiple iterations of the model.

The method according to the invention for manufacturing a semiconductor device in accordance with a device structure and using semiconductor process integration studies to optimize the manufacturing process is illustrated in the flow diagram of FIG. 8, to which reference is now made. The first step 81 in the method is to establish layouts. Next, in step 82, the semiconductor device process steps are modeled, using the representational structures heretofore described, and simulations are run. Simulation results are displayed visually, in step 83, and examined for appropriate adjustments in layout and/or process parameters, which are then made in step 84. After repeating simulations until a sequence of process steps adequately conforming to design objectives is obtained, a test device is constructed in accordance with this sequence, in step 85. The device so constructed is then examined and evaluated, in step 86, for conformity to the designed device structure. Revisions to the sequence of process steps are then made in step 87 to conform the actual device structure to the designed device structure.

While the invention has been described in terms of a single preferred embodiment those skilled in the art will recognize that the invention can be practiced with modification within the spirit and scope of the appended claims.

Having thus described my invention, what I claim as new and desire to secure by Letters Patent is as follows:

1. A computer implemented method for simulations of semiconductor device manufacturing processes, said method comprising the steps of:

defining a dynamic data structure used in the design and manufacture of a semiconductor device, said dynamic data structure comprising a multiplicity of rows representing film layers comprising a structure of said device at any point in a simulation of a semiconductor device manufacturing process, each of said rows being associated with additional information identifying said film, and a multiplicity of columns representing vertical regions within the structure of said device, each said column being associated with additional information giving horizontal dimensions of said vertical regions;

forming a matrix of cells in computer memory corresponding to a one-for-one mapping of said rows against said columns, each of said cells having a primary value and one or more associated values, said primary value being a thickness of a film layer in a vertical region; and using the matrix of cells in the computer memory, performing a computer simulation of a semiconductor device manufacturing process in which said matrix is regenerated during simulation to reflect evolution of a region structure with each step in the semiconductor device manufacturing process, said computer simulation corresponding to successive process steps in the development of the structure of said semiconductor device, wherein the number of said rows and said columns at any step are minimized.

2. The computer implemented method for simulations of semiconductor device manufacturing processes recited in claim 1 wherein the manufacture of the semiconductor device is comprised of process steps including a step of depositing a material, said step of performing a computer simulation of a semiconductor device manufacturing process including the step of prohibiting negative spacing between adjoining vertical edges in the data structure to prevent unphysical overlapping in the simulated semiconductor device process.

3. The computer implemented method for simulations of semiconductor device manufacturing processes recited in claim 1 wherein the manufacture of the semiconductor device is comprised of process steps including a step of etching, said step of performing a computer simulation of a semiconductor device manufacturing process including the step of defining thinner film layers in prior process steps to minimize topography in subsequent simulated process steps without sacrificing structural integrity.

4. The computer implemented method for simulations of semiconductor device manufacturing processes recited in claim 1 wherein said step of forming a matrix of cells in computer memory comprises the step of approximating, in said matrix, slopes and rounded corners of the semiconductor device structure by staircase shapes, said staircase shapes each being represented by several adjacent columns in said matrix.

5. The computer implemented method for simulations of semiconductor device manufacturing processes recited in claim 1 wherein the manufacture of the semiconductor device is comprised of process steps having deposition or removal rates controllable within finite limits, said data structure corresponding to the structure of said device within finite limits, and wherein random variation within said finite limits is significant during certain process steps and in certain regions of the structure of said device and corresponding data structure, said step of forming a matrix of cells comprising the step of extending the matrix by an additional dimension to provide for multiple geometries, each said geometry using a different set of assumptions randomly selected within said finite limits for said significant process steps and significant regions.

6. The computer implemented method of simulations of semiconductor device manufacturing processes recited in claim 1 wherein the manufacture of the semiconductor device is comprised of process steps including a step of depositing a material and a step of etching, said step of performing a computer simulation of a semiconductor device manufacturing process including the steps of:

prohibiting negative spacing between adjoining vertical edges in the data structure represented by said matrix to prevent unphysical overlapping in the simulated semiconductor device; and defining thinner film layers in prior process steps to minimize topography in subsequent simulated process steps without sacrificing structural integrity.

7. A method for developing a semiconductor device manufacturing process in accordance with a device structure and using semiconductor process integration studies to optimize said manufacturing process, said method comprising the steps of:

preparing an initial set of one or more device layouts for patterning film layers in accordance with said device structure;

using a dynamic data structure to model each step in said manufacturing process, each said process step having input parameters, said dynamic data structure comprising a multiplicity of rows representing film layers comprising a structure of said device, each of said rows being associated with additional information identifying said film and correlated to said input parameters, and a multiplicity of columns representing vertical regions within the structure of said device, each said column being associated with additional information giving horizontal dimensions of said vertical regions;

forming a matrix of cells in computer memory corresponding to a one-for-one mapping of said rows against said columns, each of said cells having a primary value and one or more associated values, said primary value being a thickness of a film layer in a vertical region;

using the matrix of cells in the computer memory, performing a computer simulation of a semiconductor device manufacturing process in which said matrix is regenerated during simulation to reflect evolution of a region structure with each step in the semiconductor device manufacturing process, said computer simulation generating modeled results corresponding to successive process stages in the development of the structure of the semiconductor device;

visually displaying the modeled results for each said process step;

modifying said layout and/or process parameters so as to improve conformance of said modeled results to said device structure;

constructing a test device in accordance with said process steps using said parameters as modified by said modifying step;

evaluating said test device for conformity to said device structure; and revising said process steps and said layout and/or process parameters so as to improve conformance of said test device to said device structure.

8. The method for developing a semiconductor device manufacturing process recited in claim 7 wherein the manufacture of the semiconductor device is comprised of process steps including a step of depositing a material, said step of performing a computer simulation of a semiconductor device manufacturing process including the step of prohibiting negative spacing between adjoining vertical edges in the data structure to prevent unphysical overlapping in the semiconductor device process.

9. The method for developing a semiconductor device manufacturing process recited in claim 7 wherein the manufacture of the semiconductor device is comprised of process steps including a step of etching, said step of performing a computer simulation of a semiconductor device manufacturing process including the step of defining thinner film layers in prior process steps to minimize topography in subsequent process steps without sacrificing structural integrity.

10. The method for developing a semiconductor device manufacturing process recited in claim 7 wherein said step of forming a matrix of cells in computer memory comprises the step of approximating in said matrix slopes and rounded corners of the semiconductor device structure by staircase shapes, said staircase shapes each being represented by several adjacent columns in said matrix.

11. The method for developing a semiconductor device manufacturing process recited in claim 7 wherein the manufacture of the semiconductor device is comprised of process steps having deposition and etch rates controllable within finite limits, said data structure corresponding to the structure of said device within finite limits, and wherein random variation within said finite limits is significant during certain process steps and in certain regions of the structure of said device and corresponding data structure, said step of forming a matrix of cells comprising the step of extending the matrix by an additional dimension to provide for multiple geometries, each said geometry using a different set of assumptions randomly selected within said finite limits for said significant process steps and significant regions.

12. The method for developing a semiconductor device manufacturing process recited in claim 7 wherein the manufacture of the semiconductor device is comprised of process steps including a step of depositing a material and a step of etching, said step of performing a computer simulation of a semiconductor device manufacturing process including the steps of:

prohibiting negative spacing between adjoining vertical edges in the data structure represented by said matrix to prevent unphysical overlapping in the simulated semiconductor device; and defining thinner film layers in prior process steps to minimize topography in subsequent simulated process steps without sacrificing structural integrity.

\* \* \* \* \*